(12) United States Patent
Kang et al.

(10) Patent No.: US 11,784,129 B2
(45) Date of Patent: Oct. 10, 2023

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Myungsam Kang, Hwaseong-si (KR); Youngchan Ko, Seoul (KR); Taesung Jeong, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 17/183,562

(22) Filed: Feb. 24, 2021

(65) Prior Publication Data

US 2022/0045008 A1 Feb. 10, 2022

(30) Foreign Application Priority Data

Aug. 7, 2020 (KR) .................. 10-2020-0099253

(51) Int. Cl.
*H01L 23/538* (2006.01)
*H01L 23/498* (2006.01)
(Continued)

(52) U.S. Cl.
CPC ........ *H01L 23/5383* (2013.01); *H01L 21/486* (2013.01); *H01L 21/4853* (2013.01);
(Continued)

(58) Field of Classification Search
CPC ............. H01L 23/5383; H01L 21/4853; H01L 21/4857; H01L 21/486; H01L 23/3107; H01L 23/49822; H01L 23/49838; H01L 23/5386; H01L 24/20; H01L 2224/211; H01L 2224/214; H01L 21/6835; H01L 25/0652; H01L 2221/68345; H01L 2221/68359; H01L 2225/06524; H01L 2225/06562; H01L 2225/06572; H01L 23/147; H01L 23/49816; H01L 23/5384; H01L 2225/06517; H01L 23/5385;
(Continued)

(56) References Cited

U.S. PATENT DOCUMENTS 8,709,865 B2  4/2014  Hu et al.
9,357,659 B2  5/2016  Hu et al.
(Continued)

*Primary Examiner* — Selim U Ahmed
*Assistant Examiner* — Evan G Clinton
(74) *Attorney, Agent, or Firm* — Lee IP Law, P.C.

(57) ABSTRACT

A semiconductor package and associated methods, the package including a substrate; first and second semiconductor chips on the substrate; and external terminals below the substrate, wherein the substrate includes a core portion; first and second buildup portions on top and bottom surfaces of the core portion, the first and second buildup portions including a dielectric pattern and a line pattern; and an interposer chip in an embedding region in the core portion and electrically connected to the first and second buildup portions, the interposer chip includes a base layer; a redistribution layer on the base layer; and a via that penetrates the base layer, the via being connected to the redistribution layer and exposed at a surface of the base layer, the redistribution layer is connected to a line pattern of the first buildup portion, and the via is connected to a line pattern of the second buildup portion.

15 Claims, 21 Drawing Sheets

(51) Int. Cl.
   *H01L 23/00* (2006.01)
   *H01L 21/48* (2006.01)
   *H01L 23/31* (2006.01)

(52) U.S. Cl.
   CPC ...... *H01L 21/4857* (2013.01); *H01L 23/3107* (2013.01); *H01L 23/49822* (2013.01); *H01L 23/49838* (2013.01); *H01L 23/5386* (2013.01); *H01L 24/20* (2013.01); *H01L 2224/211* (2013.01); *H01L 2224/214* (2013.01)

(58) Field of Classification Search
   CPC ..... H01L 25/18; H01L 21/56; H01L 23/3128; H01L 24/02; H01L 24/11; H01L 24/13; H01L 2224/02331; H01L 2224/02333; H01L 2224/02373; H01L 2224/02381; H01L 2224/111; H01L 2224/13008; H01L 2224/13009; H01L 25/0657; H01L 23/31; H01L 23/367; H01L 23/481; H01L 23/485; H01L 23/49827; H01L 23/50; H01L 23/525; H01L 23/528; H01L 23/5286; H01L 24/25; H01L 24/97; H01L 25/0655

See application file for complete search history.

(56) References Cited

U.S. PATENT DOCUMENTS

| | | | |
|---|---|---|---|
| 9,418,965 | B1 | 8/2016 | Li et al. |
| 9,754,890 | B2 | 9/2017 | Deshpande et al. |
| 10,068,844 | B2 | 9/2018 | Chiu et al. |
| 2010/0081236 | A1* | 4/2010 | Yang ............ H01L 24/94 257/E21.511 |
| 2015/0359098 | A1 | 12/2015 | Ock |
| 2018/0005984 | A1 | 1/2018 | Yu et al. |
| 2018/0102311 | A1* | 4/2018 | Shih ............ H01L 23/49827 |
| 2018/0358298 | A1 | 12/2018 | Zhai et al. |
| 2020/0176384 | A1* | 6/2020 | Wu ............ H01L 21/4857 |
| 2020/0395300 | A1* | 12/2020 | Xie ............ H01L 25/0655 |
| 2021/0193562 | A1* | 6/2021 | Lee ............ H01L 23/49833 |
| 2021/0202395 | A1* | 7/2021 | Lu ............ H01L 24/05 |
| 2021/0202440 | A1* | 7/2021 | Chang Chien ........ H01L 23/147 |

* cited by examiner

SEMICONDUCTOR PACKAGE AND METHOD OF FABRICATING THE SAME

CROSS-REFERENCE TO RELATED APPLICATION

Korean Patent Application No. 10-2020-0099253, filed on Aug. 7, 2020, in the Korean Intellectual Property Office, and entitled: "Semiconductor Package and Method of Fabricating the Same," is incorporated by reference herein in its entirety.

BACKGROUND

1. Field

Embodiments relate to a semiconductor package and a method of fabricating the same.

2. Description of the Related Art

With the development of the electronics industry, electronic products have increasingly exhibited high performance, high speed, and compact size. To meet the trend, a packaging technology in which a plurality of semiconductor chips are mounted in a single package has been considered.

A semiconductor package may be provided to implement an integrated circuit chip to qualify for use in electronic products.

SUMMARY

The embodiments may be realized by providing a semiconductor package including a substrate; a first semiconductor chip and a second semiconductor chip that are mounted on the substrate; and a plurality of external terminals below the substrate, wherein the substrate includes a core portion; a first buildup portion and a second buildup portion respectively on top and bottom surfaces of the core portion, each of the first and second buildup portions including a dielectric pattern and a line pattern; and an interposer chip in an embedding region in the core portion and electrically connected to the first and second buildup portions, wherein the interposer chip includes a base layer; a redistribution layer on a first surface of the base layer; and a via that penetrates the base layer, the via being connected to the redistribution layer and exposed at a second surface of the base layer, wherein the redistribution layer is connected to the line pattern of the first buildup portion, and wherein the via is connected to the line pattern of the second buildup portion.

The embodiments may be realized by providing a semiconductor package including a first wiring layer; a second wiring layer on the first wiring layer; an interposer chip between the first wiring layer and the second wiring layer; an insulating layer between the first wiring layer and the second wiring layer, the insulating layer surrounding the interposer chip; a conductive element between the first wiring layer and the second wiring layer, the conductive element being spaced apart from the interposer chip and connecting the first wiring layer to the second wiring layer; a first semiconductor chip and a second semiconductor chip that are mounted on the second wiring layer; a molding layer on the second wiring layer, the molding layer covering the first and second semiconductor chips; and a plurality of external terminals below the first wiring layer, wherein the interposer chip includes a base layer; a redistribution layer on the base layer and coupled to the second wiring layer; and a via in the base layer, the via connecting the redistribution layer to the first wiring layer, and wherein the first semiconductor chip and the second semiconductor chip are electrically connected to each other though the interposer chip.

The embodiments may be realized by providing a method of fabricating a semiconductor package, the method including forming an interposer chip that includes a base layer, a redistribution layer on a first surface of the base layer, and a via that penetrates the base layer, the via being connected to the redistribution layer and exposed on a second surface of the base layer; providing the interposer chip into a core portion that includes a conductive element; forming a first buildup portion on a top surface of the core portion and the first surface of the base layer, the first buildup portion being connected to the conductive element and the redistribution layer; forming a second buildup portion on a bottom surface of the core portion and the second surface of the base layer, the second buildup portion being connected to the conductive element and the via; mounting a plurality of semiconductor chips on the first buildup portion; and forming on the first buildup portion a molding layer that covers the plurality of semiconductor chips, wherein the plurality of semiconductor chips are electrically connected to each other through the first buildup portion and the interposer chip.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
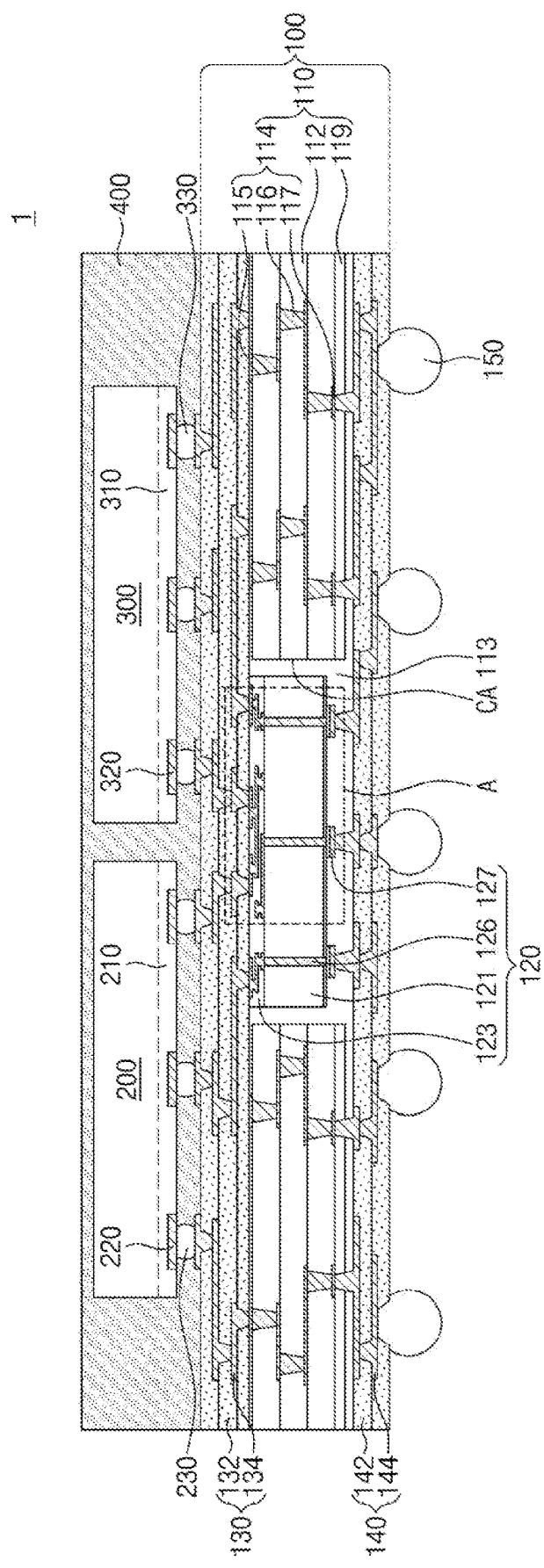
FIG. 1 is a cross-sectional view of a semiconductor package according to some example embodiments.
Figure 2:
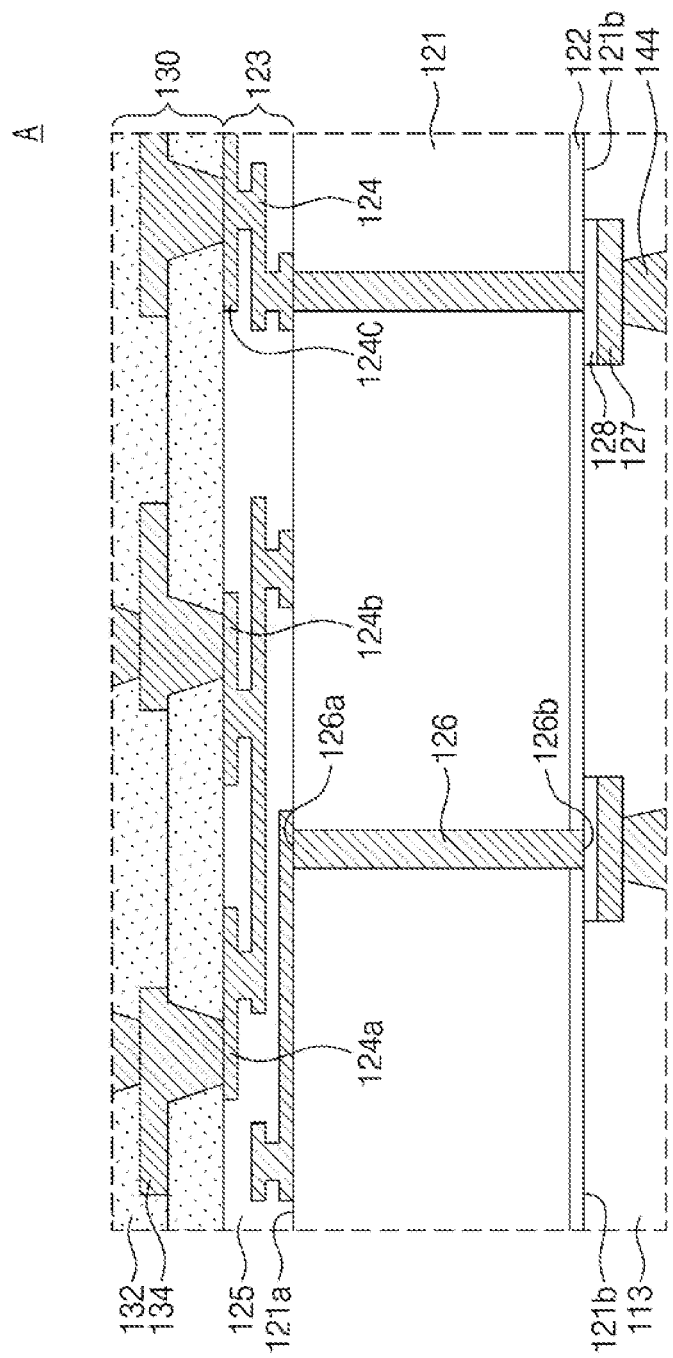
FIG. 2 is an enlarged view showing section A of FIG. 1.
Figure 3:
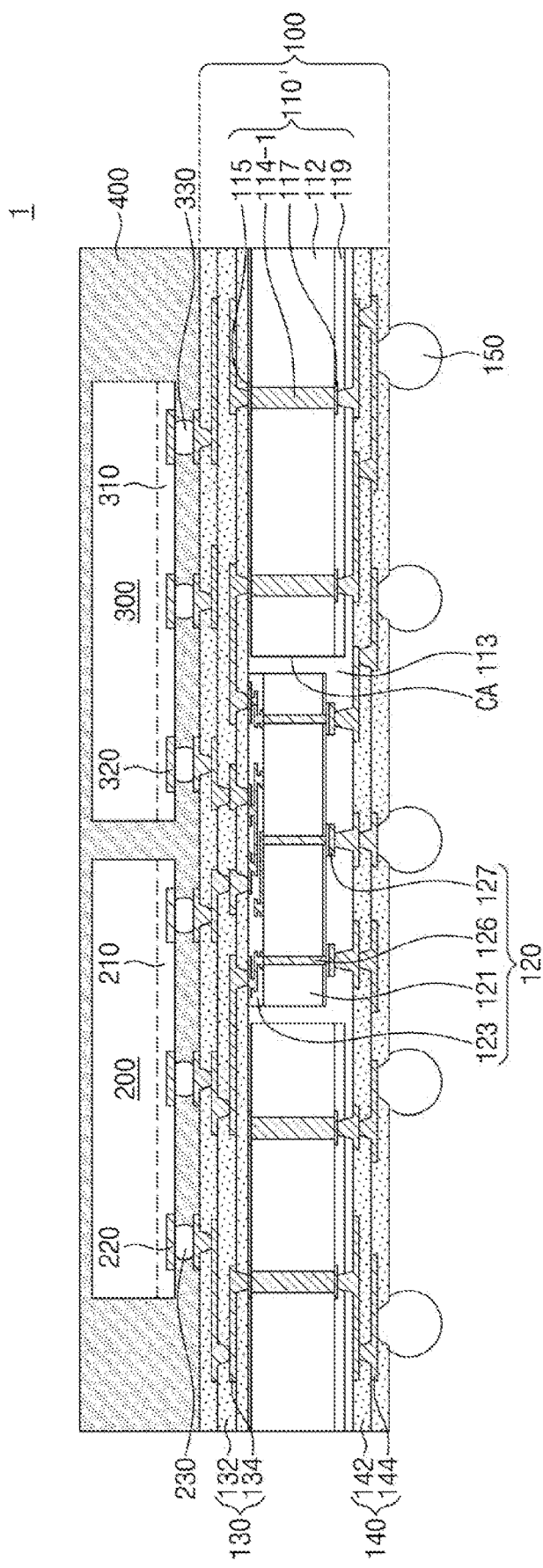
FIGS. 3 to 5 are cross-sectional views of a semiconductor package according to some example embodiments.

FIG. 1 is a cross-sectional view of a semiconductor package according to some example embodiments. FIG. 2 is an enlarged view showing section A of FIG. 1. FIG. 3 is a cross-sectional view of a semiconductor package according to some example embodiments.

Referring to FIGS. 1 and 2, a semiconductor package 1 may include a wiring substrate 100, first and second semiconductor chips 200 and 300 mounted on the wiring substrate 100, and a molding layer 400 that covers the first and second semiconductor chips 200 and 300 on the wiring substrate 100.

The wiring substrate 100 may be provided. The wiring substrate 100 may include a core portion 110, an interposer chip 120 in the core portion 110, an upper buildup portion 130 on one surface (e.g., a top surface) of the core portion 110, and a lower buildup portion 140 on another surface (e.g., a bottom surface) of the core portion 110.

The core portion 110 may extend (e.g., lengthwise) in one direction. The core portion 110 may include a core pattern whose part is removed when viewed in plan. A region CA from which the part is removed may correspond to an embedding region CA where the interposer chip 120 is disposed as discussed below. The embedding region CA may be shaped like an open hole that connects the top and bottom surfaces of the core portion 110 to each other (e.g., that extends completely through the core portion 110). In an implementation, the core portion 110 may include one core pattern. In an implementation, the core portion 110 may include two or more core patterns. In an implementation, the wiring substrate 100 may include a plurality of core patterns that are spaced apart from each other when viewed in plan. The core portion 110 may include a dielectric material. In an implementation, the core portion 110 may include glass fibers, ceramic plates, epoxy, or resins. In an implementation, the core portion 110 may include stainless steel, aluminum (Al), nickel (Ni), magnesium (Mg), zinc (Zn), tantalum (Ta), or any combination thereof. As used herein, the term "or" is not an exclusive term, e.g., "A or B" would include A, B, or A and B.

The core portion 110 may include a core dielectric pattern 112 and a core conductive pattern 114 (e.g., a wiring pattern in the core dielectric pattern 112). In an implementation, the core dielectric pattern 112 may include silicon oxide (e.g., $SiO_2$). The core conductive pattern 114 may be spaced apart from the embedding region CA. In an implementation, the core portion 110 may have, at its outer side, the core conductive pattern 114 that is outside the embedding region CA. The core conductive pattern 114 may include upper core pads 115, core wiring lines 116, and lower core pads 117. The upper core pads 115 may be on the top surface of the core portion 110. The upper core pads 115 may be electrically connected to the upper buildup portion 130 which will be discussed below. The lower core pads 117 may be on a lower part of the core portion 110. The lower core pads 117 may be electrically connected to the lower buildup portion 140 which will be discussed below. The upper and lower core pads 115 and 117 may have a thickness of about 10 μm to about 20 μm. The core wiring lines 116 may electrically connect the upper core pads 115 to the lower core pads 117. A core protection layer 119 may further be provided on a bottom surface of the core dielectric pattern 112 of the core portion 110, thereby covering the lower core pads 117. In an implementation, the core protection layer 119 may be omitted. In an implementation, the lower core pads 117 may be exposed on the bottom surface of the core portion 110.

In an implementation, as illustrated in FIG. 1, the core conductive pattern 114 may be formed buried in a plurality of stacked core dielectric patterns 112. In an implementation, as shown in FIG. 3, a core portion 110' may include a single-layered core dielectric pattern 112, and instead of the core conductive pattern 114 illustrated in FIG. 1, through electrodes 114-1 may vertically penetrate the core dielectric pattern 112. The through electrodes 114-1 may extend from top to bottom surfaces of the core dielectric pattern 112. Upper core pads 115 may be coupled to top surfaces of the through electrodes 114-1, and lower core pads 117 may be coupled to bottom surfaces of the through electrodes 114-1. The following description will focus on the embodiment shown in FIGS. 1 and 2.

The interposer chip 120 may be in the embedding region CA of the core portion 110. The core portion 110 may include the embedding region CA at its part from which the core pattern is removed. The embedding region CA may be exposed on or at the top and bottom surfaces of the core portion 110. In an implementation, the embedding region CA may be shaped like a through hole that extends from the top surface of the core portion 110 toward the bottom surface of the core portion 110. In an implementation, the embedding region CA may have a recessed shape that extends toward an inside of the core portion 110. In this case, the embedding region CA may have a floor surface that corresponds to the core protection layer 119.

The interposer chip 120 may include a base layer 121, a redistribution layer 123 on the base layer 121, and vias 126 in the base layer 121.

The base layer 121 may include silicon (Si). The base layer 121 may have a thickness of about 70 μm to about 300 μm. A chip protection layer 122 may cover a bottom surface 121b of the base layer 121. The chip protection layer 122 may be a partial section of a lower part of the base layer 121. In an implementation, the chip protection layer 122 may be a component that is formed when the lower part of the base layer 121 is partially oxidized.

The interposer chip 120 may have a top surface and a bottom surface. In this description below, the language "top surface" may be defined to refer to a surface on which are formed wiring line patterns of the interposer chip 120, and the language "bottom surface" may be defined to refer to an opposing surface that faces the top surface. In an implementation, the interposer chip 120 may include the redistribution layer 123 on or at the top surface thereof. The redistribution layer 123 may be on a top surface 121a of the base layer 121. The redistribution layer 123 may include a chip conductive pattern 124 on the top surface of the interposer chip 120, and may also include a chip dielectric layer 125 that covers the chip conductive pattern 124. The chip conductive pattern 124 may have a part that is exposed on a top surface of the chip dielectric layer 125, and the exposed part of the chip conductive pattern 124 may correspond to upper chip pads 124a, 124b, and 124c. The upper chip pads 124a, 124b, and 124c may have their exposed surfaces coplanar with that of the chip dielectric layer 125. The chip conductive pattern 124 may include a conductive material, e.g., a metal. In an implementation, the chip conductive pattern 124 may include copper (Cu). In an implementation, the chip dielectric layer 125 may include an oxide. In an implementation, the chip dielectric layer 125 may include silicon oxide (SiOx).

The vias 126 may vertically penetrate the base layer 121. The vias 126 may have their ends (or bottom surfaces) 126b that are exposed on or at the bottom surface of the interposer chip 120. The bottom surfaces 126b of the vias 126 may be coplanar with the bottom surface of the interposer chip 120 (or, with the bottom surface 121b of the chip protection layer 122, e.g., which was the bottom surface of the base layer 121 prior to forming the protection layer 122), and the bottom surfaces 126b of the vias 126 and the bottom surface of the interposer chip 120 may be substantially flat. The vias 126 may have their other ends (or top surfaces) 126a that extend toward the top surface of the interposer chip 120 and contact the redistribution layer 123. The top surfaces 126a of the vias 126 may be located at the same level as that of (e.g., may be coplanar with) the top surface 121a of the base layer 121, may be in contact with a bottom surface of the redistribution layer 123, and may be located at the same level as that of the bottom surface of the redistribution layer 123. In an implementation, the redistribution layer 123 may be higher than the vias 126. The vias 126 may be coupled to the chip conductive pattern 124 of the redistribution layer 123. The vias 126 may have a width of about 50 μm to about 150 μm.

The interposer chip 120 may further include lower chip pads 127 on or at the bottom surface thereof. The lower chip pads 127 may be on the bottom surface 121*b* of the chip protection layer 122. The lower chip pads 127 may be aligned with the vias 126, and the vias 126 may connected the lower chip pads 127 to the chip conductive pattern 124 of the redistribution layer 123. A seed layer 128 may be on each of top surfaces of the lower chip pads 127. The seed layers 128 may be between the lower chip pads 127 and the vias 126 and between the lower chip pads 127 and the chip protection layer 122.

The interposer chip 120 may be spaced apart at a certain distance from an inner wall of the embedding region CA of the core portion 110, and may be surrounded by the inner wall of the embedding region CA of the core portion 110. In an implementation, when viewed in plan, the core portion 110 may have a shape that surrounds the interposer chip 120. The interposer chip 120 may be provided in a face-up manner. In an implementation, the interposer chip 120 may be disposed to allow the redistribution layer 123 to face the top surface of the core portion 110. The interposer chip 120 may have a thickness less than that of the core portion 110. In an implementation, the interposer chip 120 may have a thickness the same as or less than that of the core portion 110. The upper chip pads 124*a*, 124*b*, and 124*c* of the interposer chip 120 may have top surfaces at a higher level than that of a top surface of the core dielectric pattern 112 of the core portion 110. The upper chip pads 124*a*, 124*b*, and 124*c* of the interposer chip 120 may be located at the same level as that of the upper core pads 115 of the core portion 110. The bottom surface of the interposer chip 120 may be located at a higher level than that of the bottom surface of the core portion 110. In an implementation, the lower chip pads 127 of the interposer chip 120 may have their bottom surfaces at a higher level than that of a bottom surface of the core protection layer 119.

In an implementation, when the embedding region CA has a recessed shape that extends toward an inside of the core portion 110, the interposer chip 120 may be placed on the floor surface of the embedding region CA. In this case, an adhesive agent or an adhesive film may be used to attach the interposer chip 120 to the floor surface of the embedding region CA.

The interposer chip 120 may not include an integrated circuit. In an implementation, the interposer chip 120 may be a component that facilitates wiring of the wiring substrate 100. A semiconductor integration circuit (IC) process may be used to form the redistribution layer 123 of the interposer chip 120 including silicon (Si), and thus the redistribution layer 123 of the interposer chip 120 may have a high line density. Therefore, the wiring substrate 100 may have a high degree of freedom of wiring. In addition, highly thermal conductive silicon (Si) and the vertically extending vias 126 may facilitate a downward discharge of heat generated from the first and second semiconductor chips 200 and 300 mounted on the wiring substrate 100. As a result, the semiconductor package 1 may have high thermal radiation efficiency.

In an implementation, the interposer chip 120 may include a certain integrated circuit. In this case, the integrated circuit may be on the top surface of the interposer chip 120. The integrated circuit may include a ground circuit or a power circuit. In an implementation, the integrated circuit may include a memory circuit, a logic circuit, or a radio frequency integrated circuit.

The embedding region CA may have therein an insulating layer 113 that fills a space between the core portion 110 and the interposer chip 120. The insulating layer 113 may extend below the interposer chip 120 and the core portion 110. In an implementation, the insulating layer 113 may cover the bottom surface of the interposer chip 120 and the bottom surface of the core portion 110. In an implementation, the insulating layer 113 may expose (e.g., may not cover or contact) the bottom surface of the interposer chip 120 and the bottom surface of the core portion 110. The insulating layer 113 may include an insulating polymer. In an implementation, the insulating layer 113 may include a thermosetting resin such as an epoxy resin, a thermoplastic resin such as polyimide, or a resin, such as Ajinomoto buildup film (ABF), flame retardant-4 (FR-4), or bismaleimide triazine (BT), including a stiffener such as an inorganic filler. In an implementation, the insulating layer 113 may include a molding material such as epoxy molding compound (EMC) or a photosensitive material such as PIE (photo-imageable epoxy).

The upper and lower buildup portions 130 and 140 may respectively cover the top and bottom surfaces of the core portion 110. The upper buildup portion 130 may cover the top surface of the core portion 110 and the top surface of the interposer chip 120. The lower buildup portion 140 may cover the bottom surface of the core portion 110 and the bottom surface of the interposer chip 120.

The upper buildup portion 130 may include upper dielectric patterns 132 and upper line patterns 134 that are sequentially stacked on the top surface of the core portion 110. The upper buildup portion 130 may cover the top surface of the core portion 110 and the redistribution layer 123 of the interposer chip 120. The lower buildup portion 140 may include lower dielectric patterns 142 and lower line patterns 144 that are sequentially stacked on the bottom surface of the core portion 110. The lower buildup portion 140 may cover the bottom surface of the core portion 110 and the chip dielectric layer 125 of the interposer chip 120. The upper and lower dielectric patterns 132 and 142 may include prepreg, Ajinomoto build-up films (ABF), flame retardant-4 (FR-4), or bismaleimide triazine (BT). The upper and lower line patterns 134 and 144 may include a circuit pattern. The upper line patterns 134 may be connected to the upper core pads 115 of the core portion 110 and to the upper chip pads 124*a*, 124*b*, and 124*c* of the interposer chip 120. In an implementation, the upper buildup portion 130 may contact the top surface of the core portion 110 and the top surface of the interposer chip 120, and the upper line patterns 134 may contact the upper core pads 115 and the upper chip pads 124*a*, 124*b*, and 124*c*. The lower line patterns 144 may be connected to the lower core pads 117 of the core portion 110 and to the lower chip pads 127 of the interposer chip 120. In an implementation, the lower buildup portion 140 may contact a bottom surface of the insulating layer 113, and the lower line patterns 144 may penetrate the insulating layer 113 to come into contact with the lower chip pads 127 and the lower core pads 117. The upper and lower line patterns 134 and 144 may include copper (Cu), aluminum (Al), silver (Ag), tin (Sn), gold (Au), nickel (Ni), lead (Pb), titanium (Ti), or any combination thereof.

External terminals 150 may be below the lower buildup portion 140. The external terminals 150 may be on a bottom surface of the lower buildup portion 140. In an implementation, the external terminals 150 may penetrate the lower dielectric patterns 142 of the lower buildup portion 140 and may be coupled to the lower line patterns 144. In an implementation, the external terminals 150 may be on substrate pads on the bottom surface of the lower buildup portion 140. In this case, the substrate pads may be either ones of the lower line patterns 144 exposed from the lower dielectric patterns 142 of the lower buildup portion 140 or separate pads that are on the lower dielectric patterns 142 of the lower buildup portion 140 and are connected to the lower line patterns 144. The external terminals 150 may be electrically connected through the lower line patterns 144 to the interposer chip 120 and the core portion 110. The external terminals 150 may include a solder ball or a solder bump.

The first semiconductor chip 200 and the second semiconductor chip 300 may be mounted on the wiring substrate 100. The first semiconductor chip 200 and the second semiconductor chip 300 may be spaced apart from each other. The first semiconductor chip 200 and the second semiconductor chip 300 may include a semiconductor material, e.g., silicon (Si). The first semiconductor chip 200 may include a first circuit layer 210 and the second semiconductor chip 300 may include a second circuit layer 310. The first circuit layer 210 of the first semiconductor chip 200 may include a logic circuit. In an implementation, the first semiconductor chip 200 may be a logic chip. The second circuit layer 310 of the second semiconductor chip 300 may include a memory circuit. In an implementation, the second semiconductor chip 300 may be a memory chip. The second semiconductor chip 300 may be provided in plural. In an implementation, the plurality of second semiconductor chips 300 may have a vertical chip stack structure. The first semiconductor chip 200 and the second semiconductor chip 300 may be flip-chip mounted on the wiring substrate 100. In an implementation, first chip terminals 230 may be on first chip pads 220 on one surface of the first circuit layer 210 of the first semiconductor chip 200. Second chip terminals 330 may be on second chip pads 320 on one surface of the second circuit layer 310 of the second semiconductor chip 300. The first chip terminals 230 and the second chip terminals 330 may be coupled to the upper line patterns 134 of the upper buildup portion 130. In an implementation, ones of the upper line patterns 134 may be pads exposed on a top surface of the upper dielectric patterns 132, and the first chip terminals 230 and the second chip terminals 330 may connect the exposed upper line patterns 134 to the first and second chip pads 220 and 320. In this case, the first semiconductor chip 200 may be connected through the interposer chip 120 to the second semiconductor chip 300. In an implementation, the first semiconductor chip 200 may be coupled through the upper buildup portion 130 to the first upper chip pad 124a of the redistribution layer 123 included in the interposer chip 120. The second semiconductor chip 300 may be coupled through the upper buildup portion 130 to the second upper chip pad 124b of the redistribution layer 123 included in the interposer chip 120. The first upper chip pad 124a and the second upper chip pad 124b may be electrically connected to each other in the redistribution layer 123. Hence, a chip-to-chip connection may be achieved between the first semiconductor chip 200 and the second semiconductor chip 300. As the first semiconductor chip 200 and the second semiconductor chip 300 are connected to each other through the redistribution layer 123 having a high line density in the interposer chip 120, a reduced electrical connection length may be accomplished between the first semiconductor chip 200 and the second semiconductor chip 300, and the semiconductor package 1 may have improved electrical characteristics.

The first and second upper chip pads 124a and 124b that connect the first and second semiconductor chips 200 and 300 to each other may be electrically floated from the vias 126 of the interposer chip 120. The third upper chip pads 124c (other than the first and second upper chip pads 124a and 124b among the upper chip pads 124a, 124b, and 124c) may be electrically connected to the vias 126.

In an implementation, the first and second upper chip pads 124a and 124b that connect the first and second semiconductor chips 200 and 300 to each other may be electrically connected to the vias 126 of the interposer chip 120. In an implementation, the first semiconductor chip 200 and the second semiconductor chip 300 may receive a power or ground signal that is externally applied through the lower buildup portion 140, the vias 126, and the third upper chip pads 124c. The power or ground signal may be transferred to the first and second semiconductor chips 200 and 300 through the interposer chip 120 that is individually separated from the core portion 110 that serves as an electrical path along which a drive signal is transferred. Accordingly, it is possible to easily group a power or ground circuit for equalization of the power or ground signal transferred to the first and second semiconductor chips 200 and 300, to effortlessly achieve a wiring design for the drive signal or for the power and ground signals, and to increase the degree of freedom of wiring.

The molding layer 400 may be on the wiring substrate 100. The wiring substrate 100 may be provided on its top surface with the molding layer 400 that covers the first and second semiconductor chips 200 and 300. The molding layer 400 may include an insulating material. In an implementation, the molding layer 400 may include an epoxy molding compound (EMC).

The semiconductor package 1 may be provided as discussed above.

Figure 4:
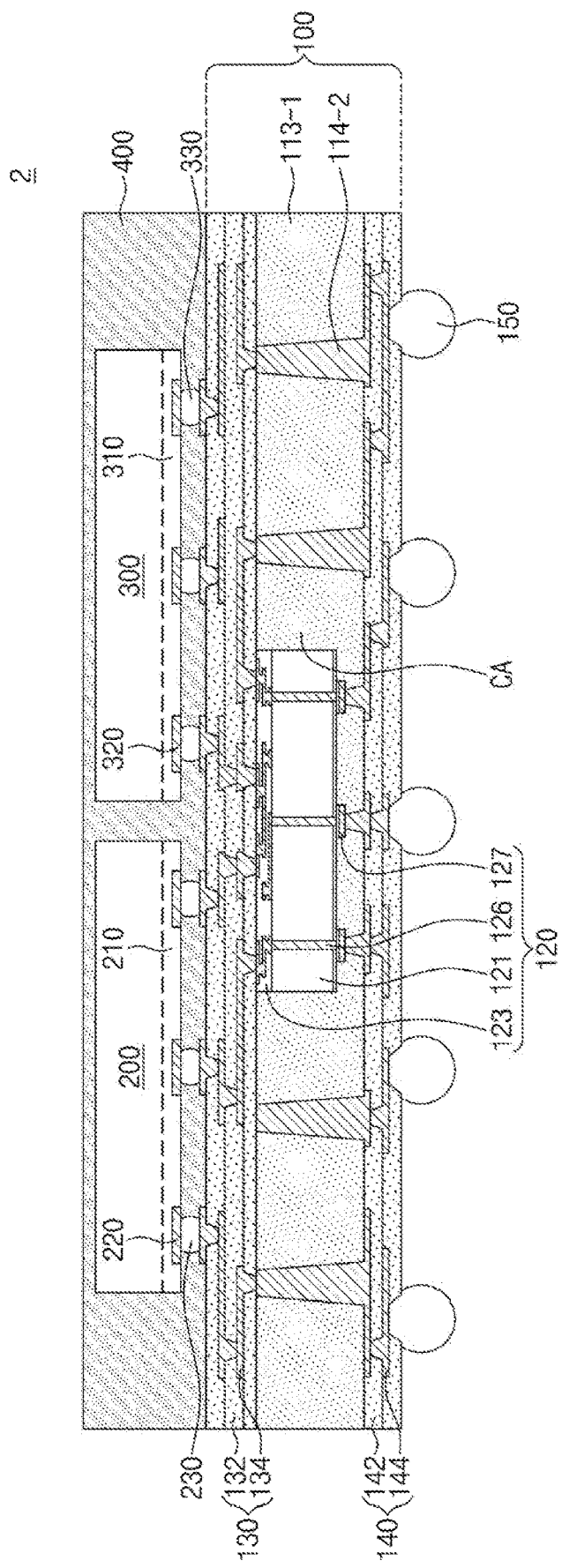

FIG. 4 is a cross-sectional view of a semiconductor package according to some example embodiments. In the embodiments that follow, a repeated detailed description of technical features discussed above with reference to FIGS. 1 to 3 may be omitted, and a difference thereof may be discussed in detail. The same components as those of the semiconductor package discussed above will be allocated the same reference numerals thereto.

Referring to FIG. 4, a semiconductor package 2 may include a wiring substrate 100, first and second semiconductor chips 200 and 300 mounted on the wiring substrate 100, and a molding layer 400 that covers the first and second semiconductor chips 200 and 300 on the wiring substrate 100.

The wiring substrate 100 may be provided. The wiring substrate 100 may include an interposer chip 120, an upper buildup portion 130 on the interposer chip 120, and a lower buildup portion 140 below the interposer chip 120.

The interposer chip 120, the upper buildup portion 130, and the lower buildup portion 140 may be substantially the same as or similar to those discussed with reference to FIGS. 1 to 3.

In an implementation, the interposer chip 120 may include the base layer 121, the redistribution layer 123 on the base layer 121, and the vias 126 in the base layer 121. The base layer 121 may include silicon (Si). The redistribution layer 123 may be on the top surface 121a of the base layer 121. The vias 126 may penetrate the base layers 121 and may be coupled to the redistribution layer 123. The lower chip pads 127 may be on the bottom surface 121b of the chip protection layer 122 and may be aligned with the vias 126.

The upper buildup portion 130 may include the upper dielectric patterns 132 and the upper line patterns 134 that are sequentially stacked on the interposer chip 120. The upper line patterns 134 may be connected to the upper chip pads 124a, 124b, and 124c of the interposer chip 120.

The lower buildup portion 140 may include the lower dielectric patterns 142 and the lower line patterns 144 that are sequentially stacked below the interposer chip 120. The lower line patterns 144 may be connected to the lower chip pads 127 of the interposer chip 120.

An insulating layer 113-1 may fill a space between the lower buildup portion 140 and the upper buildup portion 130. The insulating layer 113-1 may bury the interposer chip 120 between the lower buildup portion 140 and the upper buildup portion 130. In an implementation, when viewed in plan, the insulating layer 113-1 may surround the interposer chip 120. The insulating layer 113-1 may contact a lateral surface of the interposer chip 120. A part of the insulating layer 113-1 may cover the bottom surface of the interposer chip 120. In an implementation, the lower chip pads 127 of the interposer chip 120 may not be exposed. The insulating layer 113-1 may include an insulating material, e.g., an epoxy molding compound (EMC). In an implementation, the insulating layer 113-1 may include an insulating polymer. In an implementation, the insulating layer 113-1 may include a thermosetting resin such as an epoxy resin, a thermoplastic resin such as polyimide, or a resin, such as Ajinomoto buildup film (ABF), flame retardant-4 (FR-4), or bismaleimide triazine (BT), including a stiffener such as an inorganic filler. In an implementation, the insulating layer 113-1 may include a molding material such as an epoxy molding compound (EMC) or a photosensitive material such as photo-imageable epoxy (PIE).

Through electrodes 114-2 may be in the insulating layer 113-1. At a side of the interposer chip 120, the through electrodes 114-2 may vertically penetrate the insulating layer 113-1. The through electrodes 114-2 may have a width that decreases as approaching the upper buildup portion 130 (e.g., the through electrodes 114-2 may have a tapered shape). The through electrodes 114-2 may penetrate the insulating layer 113-1 and may be exposed on or at a top surface of the insulating layer 113-1. The upper line patterns 134 of the upper buildup portion 130 may penetrate the upper dielectric patterns 132 and may contact top surfaces of the through electrodes 114-2. The through electrodes 114-2 may penetrate the insulating layer 113-1 and may be exposed on or at a bottom surface of the insulating layer 113-1. The lower line patterns 144 of the lower buildup portion 140 may penetrate the lower dielectric patterns 142 and may contact bottom surfaces of the through electrodes 114-2. In such a configuration, the lower line pattern 144 in contact with the through electrode 114-2 may be integrally formed with the through electrode 114-2. The lower line patterns 144 may also penetrate the insulating layer 113-1 and may be coupled to the lower chip pads 127.

Figure 5:
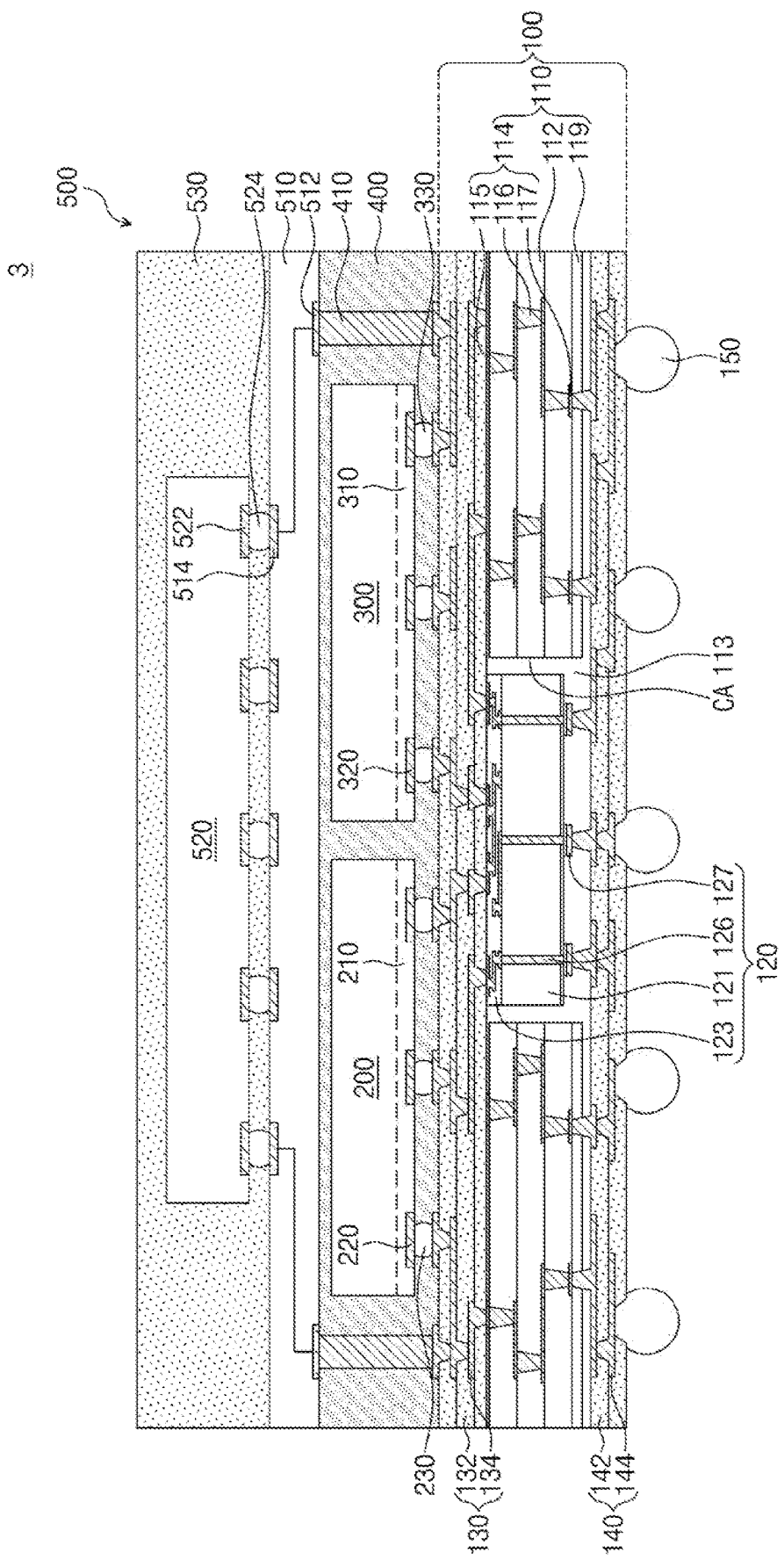

FIG. 5 is a cross-sectional view of a semiconductor package according to some example embodiments.

Referring to FIG. 5, a semiconductor package 3 may include a wiring substrate 100, first and second semiconductor chips 200 and 300 mounted on the wiring substrate 100, and a molding layer 400 that covers the first and second semiconductor chips 200 and 300 on the wiring substrate 100.

The wiring substrate 100, the first and second semiconductor chips 200 and 300, and the molding layer 400 may be substantially the same as or similar to those discussed with reference to FIGS. 1 to 3. For example, the wiring substrate 100 may include the core portion 110, an interposer chip 120 in the embedding region CA of the core portion 110, the upper buildup portion 130 on the core portion 110, and the lower buildup portion 140 below the core portion 110. The first and second semiconductor chips 200 and 300 may be mounted on the upper buildup portion 130 of the wiring substrate 100. The first and second semiconductor chips 200 and 300 may be connected to each other through the upper buildup portion 130 and the redistribution layer 123 of the interposer chip 120. On the wiring substrate 100, the molding layer 400 may cover the first and second semiconductor chips 200 and 300.

The semiconductor package 3 may further include an upper package 500 on the molding layer 400. In an implementation, the semiconductor package 3 may be provided in the structure of package-on-package (POP).

The upper package 500 may include an upper substrate 510, an upper semiconductor chip 520, and an upper molding layer 530.

The upper substrate 510 may be a printed circuit board (PCB). In an implementation, the upper substrate 510 may be a redistribution layer. The upper substrate 510 may include first upper substrate pads 512 on a bottom surface of the upper substrate 510, and may also include second upper substrate pads 514 on a top surface of the upper substrate 510.

The upper semiconductor chip 520 may be mounted on the upper substrate 510. In an implementation, the upper semiconductor chip 520 may be flip-chip mounted on the upper substrate 510. The upper semiconductor chip 520 may be mounted on the upper substrate 510 through third chip terminals 524 between the second upper substrate pads 514 and upper chip pads 522. The upper semiconductor chip 520 may include a memory chip or a logic chip. In an implementation, as illustrated in FIG. 5, a single upper semiconductor chip 520 may be provided. In an implementation, the upper semiconductor chip 520 may be provided in plural. In this case, the plurality of upper semiconductor chips 520 may be provided either stacked on one another or horizontally spaced apart from each other on the upper substrate 510.

The upper molding layer 530 may be on the upper substrate 510. On the upper substrate 510, the upper molding layer 530 may cover the upper semiconductor chip 520. The upper molding layer 530 may include an insulating material, e.g., an epoxy molding compound (EMC).

The upper package 500 may be on the wiring substrate 100. In an implementation, connection terminals 410 may be in the molding layer 400. The connection terminals 410 may penetrate the molding layer 400 and may connect the first upper substrate pads 512 of the upper substrate 510 to the upper line patterns 134 of the upper buildup portion 130 in the wiring substrate 100. In an implementation, as illustrated in FIG. 5, the connection terminals 410 may be conductive posts that are formed to vertically penetrate the molding layer 400. In an implementation, the connection terminals 410 may include a soldering member such as a solder ball or a solder bump, or may have various structures capable of mechanically connecting the first upper substrate pads 512 to the upper line patterns 134. The upper package 500 may be electrically connected to the external terminals 150 through the connection terminals 410 and the wiring substrate 100.

The semiconductor package 3 may be provided as discussed above.

FIGS. 6 to 17 are cross-sectional views of stages in a method of fabricating a semiconductor package according to some example embodiments. Of the FIGS. 6 to 17, FIGS. 6 to 11 are cross-sectional views of a method of fabricating an interposer chip according to some example embodiments.

Figure 6:
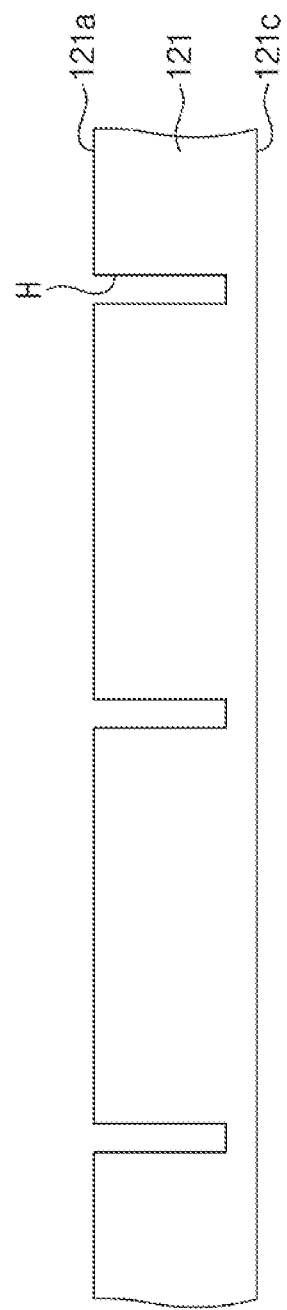
FIGS. 6 to 11 are cross-sectional views of stages in a method of fabricating an interposer chip according to some example embodiments.

Referring to FIG. 6, a base layer 121 may be provided. The base layer 121 may include, e.g., a semiconductor wafer. In an implementation, the base layer 121 may be a silicon wafer. The base layer 121 may have a first surface 121a and a second surface 121c opposite to the first surface 121a.

Holes H may be formed on the base layer 121. The holes H may be formed by performing a process such as laser drilling on the first surface 121a of the base layer 121. In an implementation, the holes H may be formed by forming a mask pattern on the first surface 121a of the base layer 121, and then using the mask pattern as an etching mask to perform an anisotropic etching process. None of the holes H may vertically completely penetrate the base layer 121. In an implementation, the holes H may be formed spaced apart from the second surface 121c.

Figure 7:
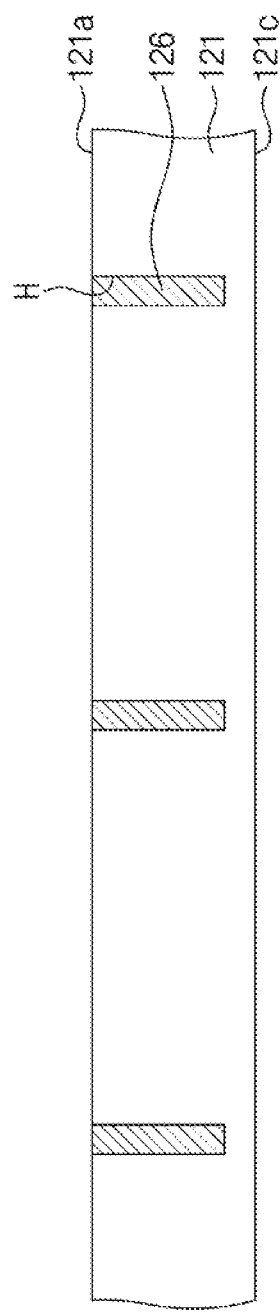

Referring to FIG. 7, vias 126 may be formed in the base layer 121. In an implementation, a conductive material may be coated or deposited on the first surface 121a of the base layer 121. The conductive material may fill the holes H of the base layer 121. Afterwards, a part of the conductive material may be removed from the first surface 121a of the base layer 121, and the conductive material may remain only in the holes H.

Figure 8:
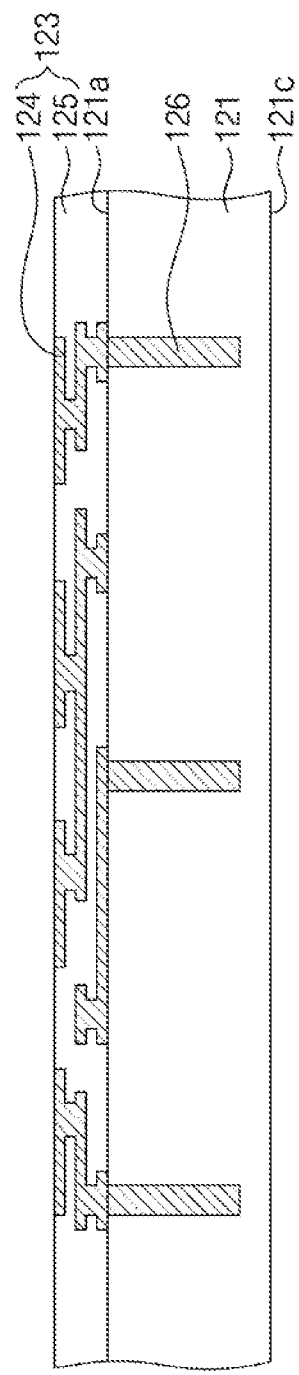

Referring to FIG. 8, a redistribution layer 123 may be formed on the first surface 121a of the base layer 121. In an implementation, a dielectric layer, such as silicon oxide, may be formed on the first surface 121a of the base layer 121, and then the dielectric layer may be patterned to form a part of a chip dielectric layer 125. The chip dielectric layer 125 may expose the vias 126. A conductive layer may be formed on a top surface of the chip dielectric layer 125, and then the conductive layer may be patterned to form a chip conductive pattern 124. The chip conductive pattern 124 may be electrically connected to the vias 126. As discussed above, the formation and pattering of the dielectric layer and the formation and patterning of the conductive layer may be repeatedly performed to form the redistribution layer 123.

Figure 9:
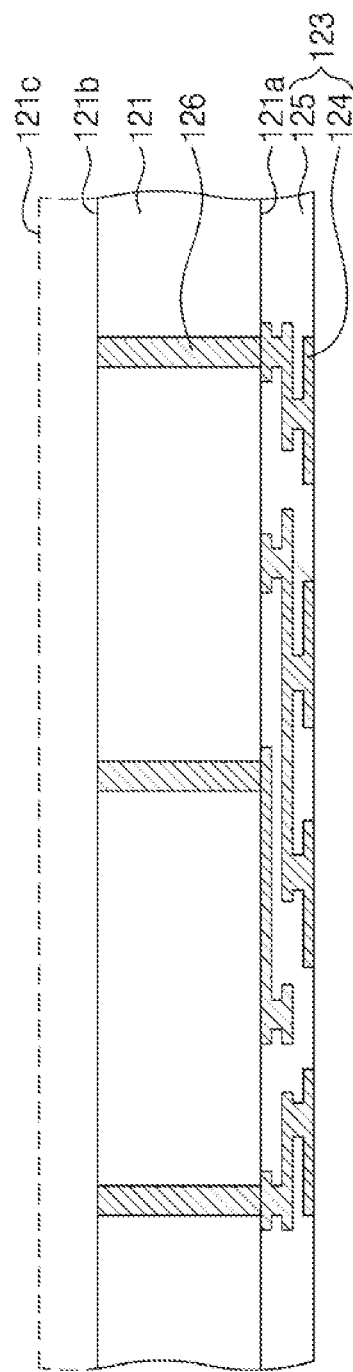

Referring to FIG. 9, a part of the base layer 121 may be removed. In an implementation, the base layer 121 may be thinned to expose the vias 126. In an implementation, the second surface 121c of the base layer 121 may undergo a thinning process, such as grinding or chemical vapor polishing (CMP). The thinning process may cause the base layer 121 to have a third surface 121b coplanar with ends of the vias 126. In an implementation, the third surface 121b of the base layer 121 and the ends of the vias 126 may be substantially flat.

Figure 10:
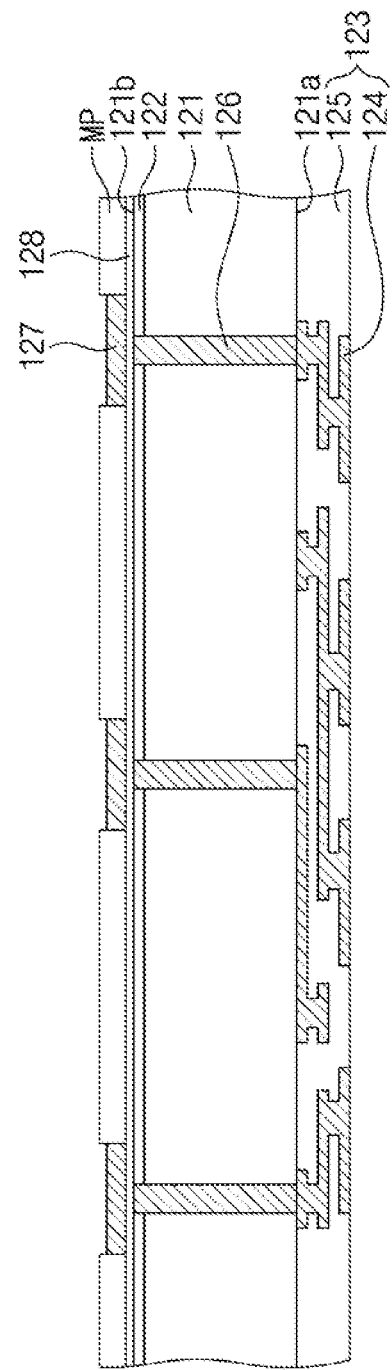

Referring to FIG. 10, a chip protection layer 122 may be formed on or in the third surface 121b of the base layer 121. In an implementation, an oxidation process or a nitridation process may be performed on the exposed third surface 121b of the base layer 121. Therefore, the third surface 121b of the base layer 121 may be partially oxidized or nitrided to form the chip protection layer 122. The chip protection layer 122 may have a top surface coplanar with the ends of the vias 126.

Lower chip pads 127 may be formed on the chip protection layer 122. In an implementation, a seed layer 128 may be formed on the chip protection layer 122. The seed layer 128 may cover the top surface of the chip protection layer 122 and the ends (or top surfaces) of the vias 126. A mask pattern MP may be formed on the seed layer 128. The mask pattern MP may have openings that overlap the vias 126. Thereafter, the seed layer 128 may be used as a seed used for a plating process to form the lower chip pads 127 that fill the openings. The lower chip pads 127 may be formed on the vias 126.

Figure 11:
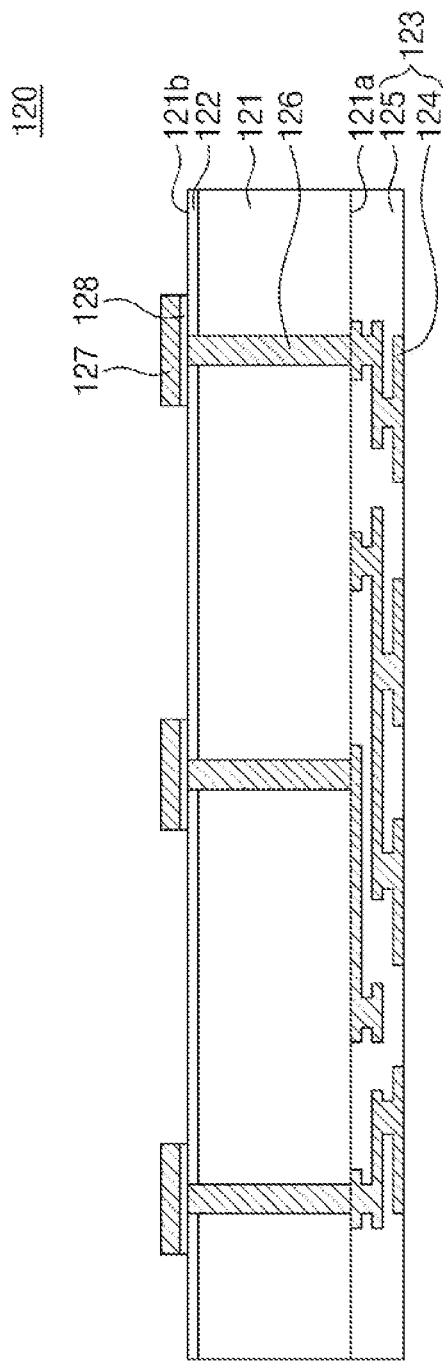

Referring to FIG. 11, the mask pattern MP may be removed. After that, the lower chip pads 127 may be used as an etching mask to pattern the seed layer 128. Therefore, the seed layer 128 may be patterned to remain between the chip protection layer 122 and the lower chip pads 127 and between the vias 126 and the lower chip pads 127.

The process mentioned above may form an interposer chip 120.

In an implementation, as illustrated in FIGS. 6 to 11, a single interposer chip 120 may be formed on the base layer 121. In an implementation, a plurality of interposer chips 120 may be formed on a single base layer 121, and in this case, after the formation of the interposer chips 120, the base layer 121 may undergo a sawing process to separate the interposer chips 120 from each other.

The following will continuously discuss a method of fabricating a semiconductor package.

Figure 12:
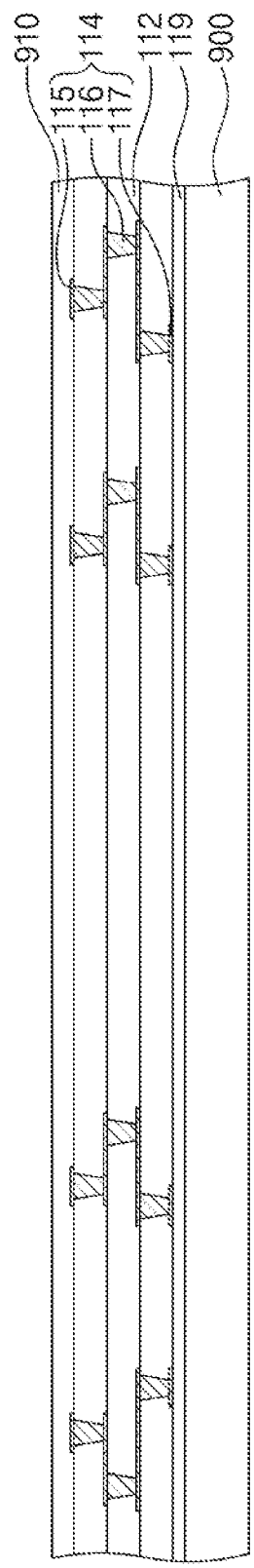
FIGS. 12 to 17 are cross-sectional views of stages in a method of fabricating a semiconductor package according to some example embodiments.

Referring to FIG. 12, a core portion 110 may be provided. The core portion 110 may include a core dielectric pattern 112 and a core conductive pattern 114 formed in the core dielectric pattern 112. The core conductive pattern 114 may include upper core pads 115, core wiring lines 116, and lower core pads 117. A core protection layer 119 may be formed on a bottom surface of the core dielectric pattern 112. In an implementation, a dielectric material may be coated on the bottom surface of the core dielectric pattern 112, thereby forming the core protection layer 119.

A first carrier substrate 900 may be attached to a bottom surface of the core portion 110. The first carrier substrate 900 may be a dielectric substrate including glass or polymer or a conductive substrate including metal. The first carrier substrate 900 may be provided on its top surface with an adhesive member through which the first carrier substrate 900 may be attached to a bottom surface of the core protection layer 119. In an implementation, the adhesive member may include a glue tape.

A protection layer 910 may be formed on the core portion 110.

Figure 13:
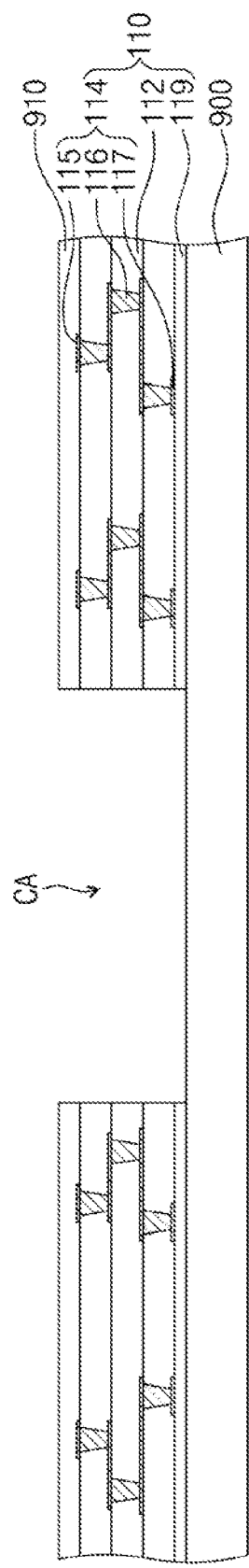

Referring to FIG. 13, an embedding region CA may be formed in the core portion 110. The embedding region CA may be formed by removing a partial region of the core portion 110 so as to allow the embedding region CA to penetrate the core portion 110. In an implementation, the embedding region CA may be formed by performing an etching process such as drilling, laser ablation, or laser cutting. The removed partial region of the core portion 110 may be a space where the interposer chip 120 is to be provided in a subsequent process.

Figure 14:
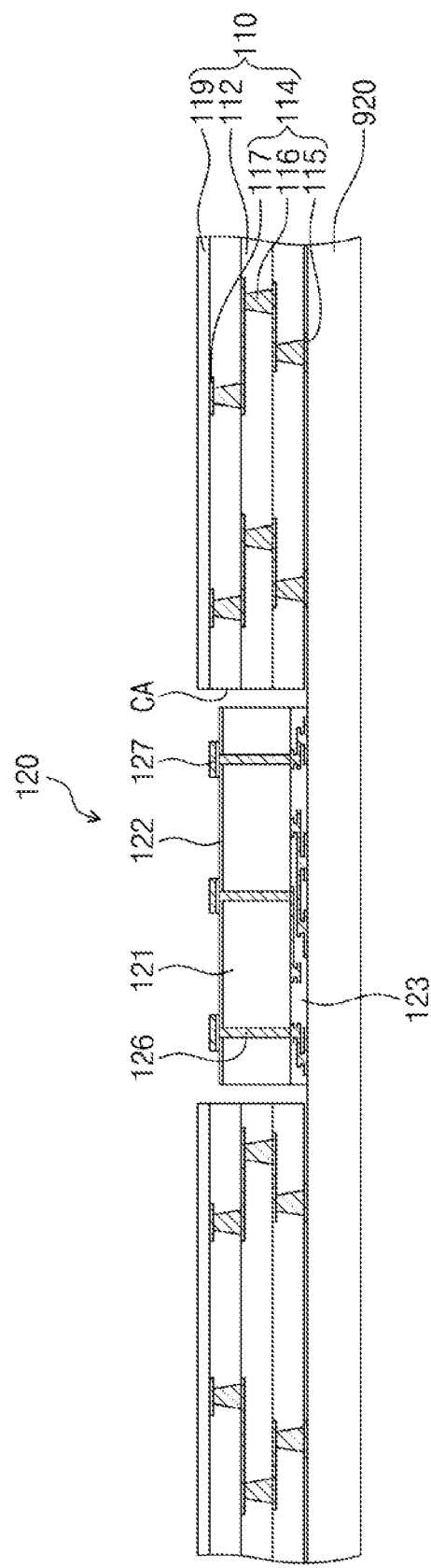

Referring to FIG. 14, the first carrier substrate 900 and the protection layer 910 may be removed from a resultant structure of FIG. 13.

A second carrier substrate 920 may be attached to the core portion 110. The second carrier substrate 920 may be an insulating substrate including glass or polymer or a conductive substrate including metal. The second carrier substrate 920 may be provided on its top surface with an adhesive member through which the second carrier substrate 920 may be attached to the core portion 110. In an implementation, the adhesive member may include a glue tape. The core portion 110 may be attached to the second carrier substrate 920 so as to allow the upper core pads 115 to face the second carrier substrate 920.

The interposer chip 120 may be provided on the second carrier substrate 920. The interposer chip 120 may be in the embedding region CA of the core portion 110. The interposer chip 120 may be adhered to the second carrier substrate 920. In an implementation, the interposer chip 120 may be attached to the second carrier substrate 920 so as to allow the redistribution layer 123 to face the second carrier substrate 920. Therefore, the redistribution layer 123 of the interposer chip 120 may have a surface at a lower level than that of the bottom surface of the core dielectric pattern 112 of the core portion 110 and at the same level as that of surfaces of the upper core pads 115.

Figure 15:
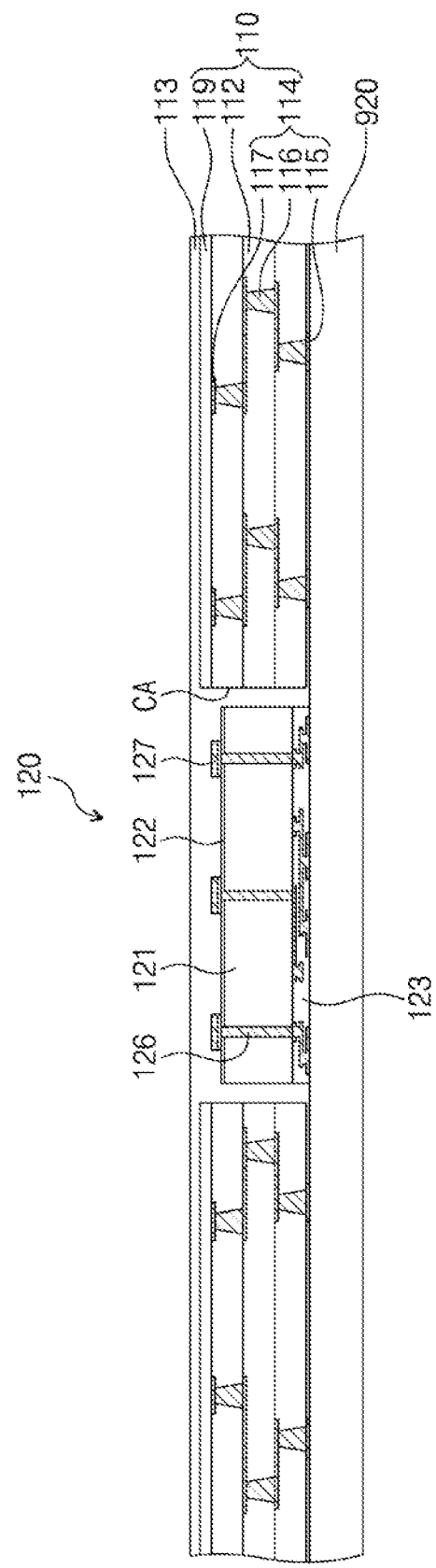

Referring to FIG. 15, an insulating layer 113 may be formed on the second carrier substrate 920. The insulating layer 113 may fill a gap between the core portion 110 and the interposer chip 120. In an implementation, an insulating member may be introduced into a gap between the core portion 110 and the interposer chip 120, and then the insulating member may be cured to form the insulating layer 113. In an implementation, the insulating member may be formed to cover the interposer chip 120. Thus, none of the lower chip pads 127 of the interposer chip 120 may be exposed. In addition, a part of the insulating member may cover a top surface of the core portion 110. In an implementation, the insulating layer 113 may be formed not to cover the top surface of the core portion 110 or a top surface of the interposer chip 120.

Figure 16:
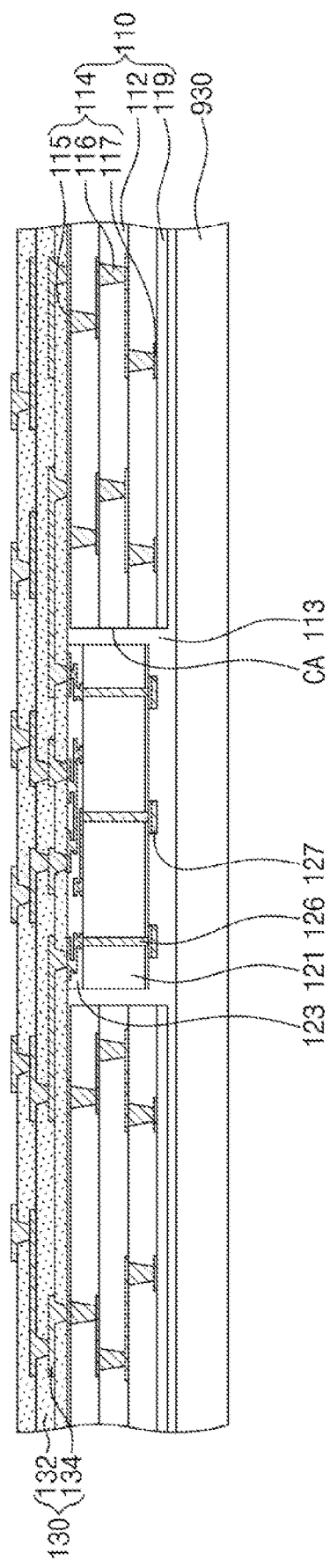

Referring to FIG. 16, a third carrier substrate 930 may be attached to the insulating layer 113. The third carrier substrate 930 may be a dielectric substrate including glass or polymer or a conductive substrate including metal. The third carrier substrate 930 may be provided on its top surface with an adhesive member through which the third carrier substrate 930 may be attached to the insulating layer 113. In an implementation, the adhesive member may include a glue tape. Thereafter, the second carrier substrate 920 may be removed.

An upper buildup portion 130 may be formed on the top surfaces of the interposer chip 120 and the core portion 110 that are exposed by the removal of the second carrier substrate 920. In an implementation, upper dielectric patterns 132 and upper line patterns 134 may be formed on the top surfaces of the core portion 110 and the interposer chip 120, thereby forming the upper buildup portion 130. A dielectric layer, such as silicon oxide, may be formed on the top surfaces of the core portion 110 and the interposer chip 120, and then the dielectric layer may be patterned to form a part of the upper dielectric patterns 132. The upper dielectric patterns 132 may expose the upper core pads 115 of the core portion 110 and upper chip pads (see 124a, 124b, and 124c of FIG. 2) of the interposer chip 120. A conductive layer may be formed on top surface of the upper dielectric patterns 132, and then the conductive layer may be patterned to form the upper line patterns 134. The upper line patterns 134 may have corresponding electrical connections with the upper core pads 115 and the upper chip pads (see 124a, 124b, and 124c of FIG. 2). A dielectric layer may be formed on a top surface of the upper line patterns 134, and then the dielectric layer may be patterned to form other part of the upper dielectric patterns 132. The other part of the upper line patterns 134 may be exposed on the upper dielectric patterns 132.

Figure 17:
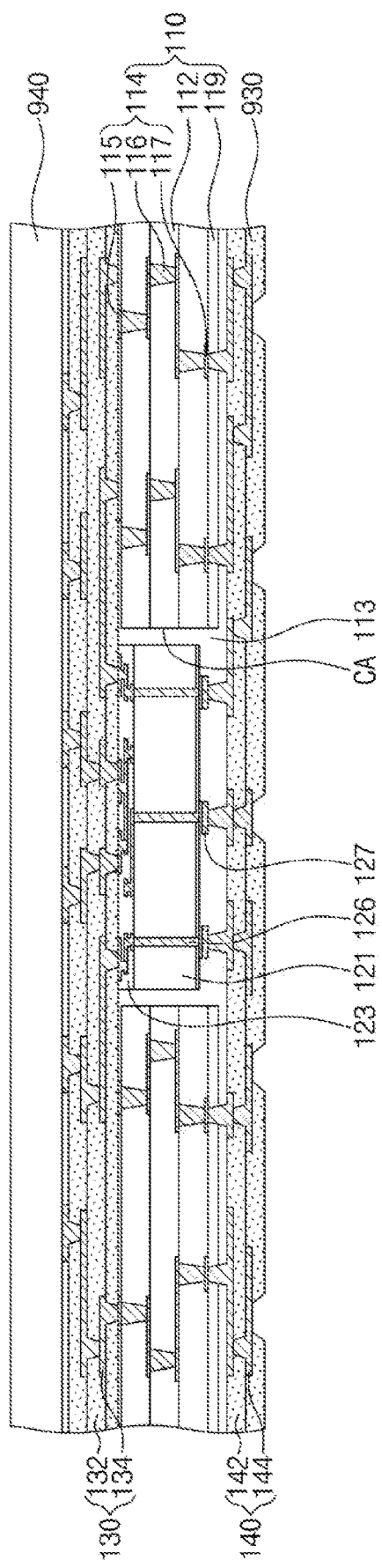

Referring to FIG. 17, a fourth carrier substrate 940 may be attached to the upper buildup portion 130. The fourth carrier substrate 940 may be a dielectric substrate including glass or polymer or a conductive substrate including metal. The fourth carrier substrate 940 may be provided on its top surface with an adhesive member through which the fourth carrier substrate 940 may be attached to the upper buildup portion 130. In an implementation, the adhesive member may include a glue tape. Thereafter, the third carrier substrate 930 may be removed.

A lower buildup portion 140 may be formed on bottom surfaces of the interposer chip 120 and the core portion 110 that are exposed by the removal of the third carrier substrate 930. In an implementation, lower dielectric patterns 142 and lower line patterns 144 may be formed on the bottom surfaces of the core portion 110 and the interposer chip 120, thereby forming the lower buildup portion 140. The insulating layer 113 may be patterned to expose the lower chip pads 127 of the interposer chip 120 and the lower core pads 117 of the core portion 110, a conductive layer may be formed on a bottom surface of the insulating layer 113, and then the conductive layer may be patterned to form a part of the lower line patterns 144. The lower line patterns 144 may have corresponding electrical connection with the lower chip pads 127 and the lower core pads 117. A dielectric layer may be formed on bottom surfaces of the lower line patterns 144 and may be patterned to form other parts of the lower dielectric patterns 142. The lower line patterns 144 may be partially exposed on the lower dielectric patterns 142.

Afterward, the fourth carrier substrate 940 may be removed to form a wiring substrate 100.

Referring back to FIG. 1, first and second semiconductor chips 200 and 300 may be mounted on the wiring substrate 100. The first and second semiconductor chips 200 and 300 may be flip-chip mounted.

A molding layer 400 may be formed on the wiring substrate 100. For example, a dielectric material may be coated on the wiring substrate 100 so as to cover the first and second semiconductor chips 200 and 300, and then the dielectric material may be cured to form the molding layer 400.

External terminals 150 may be provided on a bottom surface of the wiring substrate 100. The external terminals 150 may be formed by providing a soldering member, such as a solder ball or a solder bump, onto surfaces of the lower line patterns 144 that are exposed by patterning the lower dielectric patterns 142.

A semiconductor package 1 may be formed through the process mentioned above.

In an implementation, as illustrated in FIGS. 12 to 17, a single semiconductor package 1 may be formed on a single wiring substrate 100. In an implementation, a plurality of semiconductor packages 1 may be formed on a single wiring substrate 100, and in this case, after the formation of the semiconductor packages 1, the wiring substrate 100 and the molding layer 400 may undergo a sawing process to separate the semiconductor packages 1 from each other.

FIGS. 18 to 21 are cross-sectional views of stages in a method of fabricating a semiconductor package according to some example embodiments.

Figure 18:
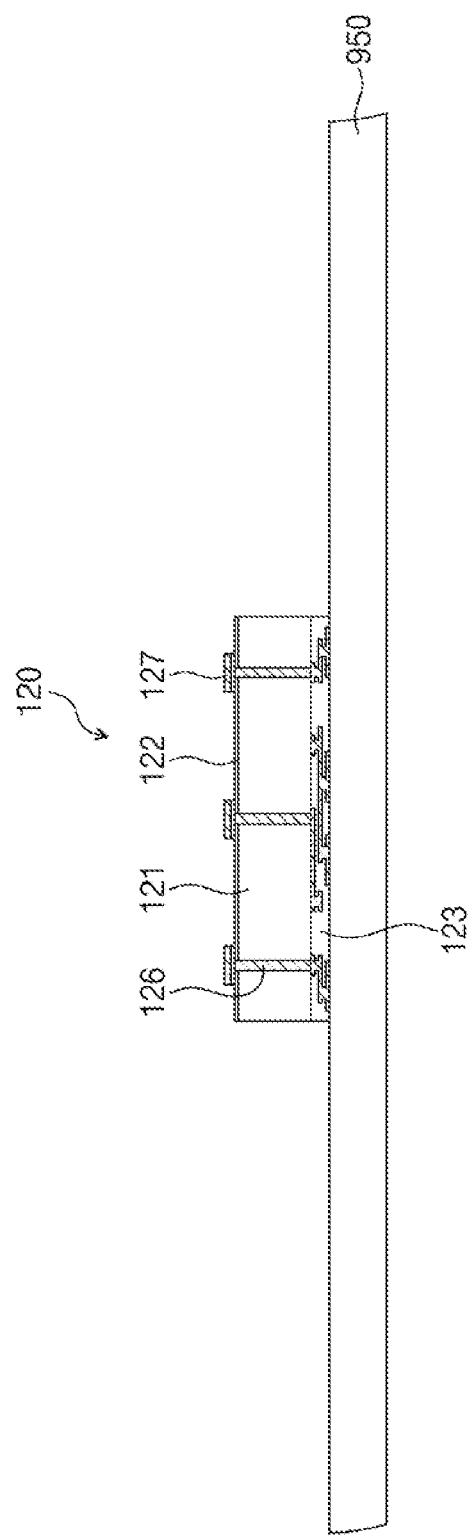
FIGS. 18 to 21 are cross-sectional views of stages in a method of fabricating a semiconductor package according to some example embodiments.

Referring to FIG. 18, the interposer chip 120 may be provided on a fifth carrier substrate 950. The interposer chip 120 may be attached to the fifth carrier substrate 950. In an implementation, the interposer chip 120 may be attached to the fifth carrier substrate 950 so as to allow the redistribution layer 123 to face the fifth carrier substrate 950.

Figure 19:
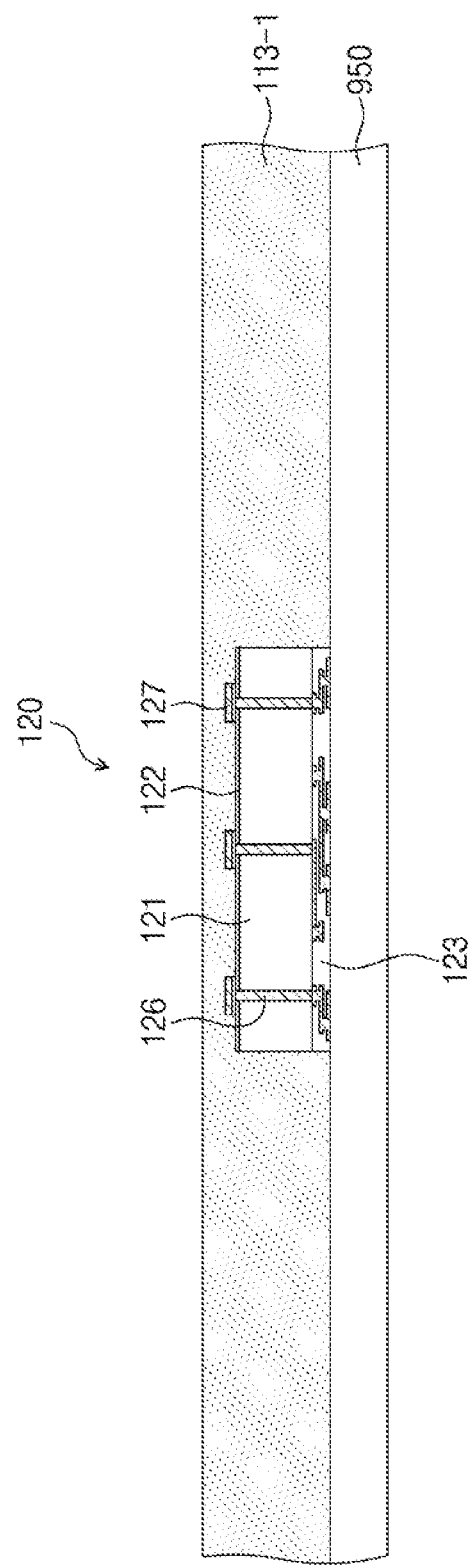

Referring to FIG. 19, an insulating layer 113-1 may be formed on the fifth carrier substrate 950. An insulating material may be coated on the fifth carrier substrate 950, thereby forming the insulating layer 113-1. The insulating material may be coated to cover the interposer chip 120 on the fifth carrier substrate 950. The insulating layer 113-1 may cover a lateral surface of the interposer chip 120 and the top surface of the interposer chip 120 (or, a top surface of the chip protection layer 122 and top surfaces of the lower chip pads 127). The insulating material may include an insulating polymer, such as an epoxy molding compound (EMC).

Figure 20:
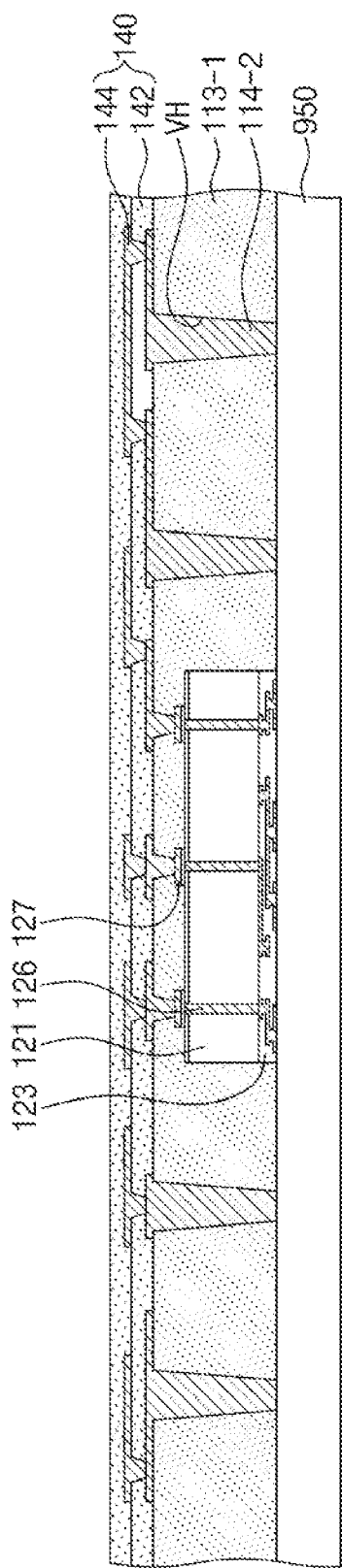

Referring to FIG. 20, through electrodes 114-2 may be formed in the insulating layer 113-1. In an implementation, via holes VH may be formed to vertically penetrate the insulating layer 113-1, and then the via holes VH may be filled with a conductive material to form the through electrodes 114-2. When the via holes VH are filled with the conductive material, the conductive material may be coated on the insulating layer 113-1 so as to cover a top surface of the insulating layer 113-1, and the conductive material on the insulating layer 113-1 may be patterned to form a part of the lower line patterns 144 of a lower buildup portion 140 which will be discussed below.

A lower buildup portion 140 may be formed on the insulating layer 113-1. In an implementation, lower dielectric patterns 142 and lower line patterns 144 may be formed on the top surface of the insulating layer 113-1, thereby forming the lower buildup portion 140. The insulating layer 113-1 may be patterned to expose the through electrodes 114-2 and the lower chip pads 127 of the interposer chip 120, a conductive layer may be formed on the top surface of the insulating layer 113-1, and then the conductive layer may be patterned to form a part of the lower line patterns 144. The lower line patterns 144 may have corresponding electrical connections with the lower chip pads 127 and the through electrodes 114-2. A dielectric layer may be formed on bottom surfaces of the lower line patterns 144 and may be patterned to form other part of the lower dielectric patterns 142. The lower line patterns 144 may be partially exposed on the lower dielectric patterns 142.

Figure 21:
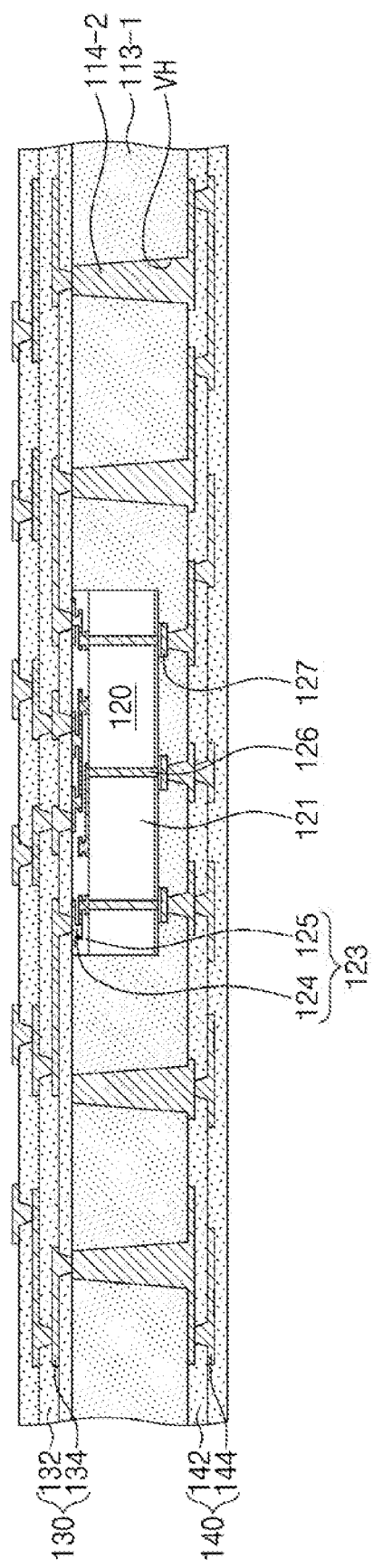

Referring to FIG. 21, an upper buildup portion 130 may be formed on surfaces of the insulating layer 113-1 and the interposer chip 120 that are exposed by the removal of the fifth carrier substrate 950. In an implementation, upper dielectric patterns 132 and upper line patterns 134 may be formed on the surfaces of the insulating layer 113-1 and the interposer chip 120, thereby forming the upper buildup portion 130. A dielectric layer, such as silicon oxide, may be formed on the surfaces of the insulating layer 113-1 and the interposer chip 120, and then the dielectric layer may be patterned to form a part of the upper dielectric patterns 132. The upper dielectric patterns 132 may expose the through electrodes 114-2 in the insulating layer 113-1 and upper chip pads (see 124a, 124b, and 124c of FIG. 2) of the interposer chip 120. A conductive layer may be formed on a top surface of the upper dielectric patterns 132, and then the conductive layer may be patterned to form the upper line patterns 134. The upper line patterns 134 may have correspond electrical connections with the through electrodes 114-2 and the upper chip pads (see 124a, 124b, and 124c of FIG. 2). A dielectric layer may be formed on top surfaces of the upper line patterns 134, and then the dielectric layer may be patterned to form other part of the upper dielectric patterns 132. The upper line patterns 134 may be partially exposed on the upper dielectric patterns 132. The processes discussed above may form a wiring substrate 100 discussed with reference to FIG. 4.

Afterwards, identical or similar processes to those discussed in FIG. 1 may be performed. In an implementation, as shown in FIG. 4, first and second semiconductor chips 200 and 300 may be mounted on the wiring substrate 100. A molding layer 400 may be formed on the wiring substrate 100, covering the first and second semiconductor chips 200 and 300. External terminals 150 may be provided on a bottom surface of the wiring substrate 100.

The processes mentioned above may form a semiconductor package 3 discussed with reference to FIG. 4.

In a semiconductor package according to some example embodiments, a high line density may be provided to a redistribution layer of an interposer chip including silicon (Si), and a high degree of freedom of wiring may be given to a wiring substrate. A power or ground signal may be transferred to semiconductor chips through the interposer chip that is individually separated from a core portion that serves as an electrical path along which a drive signal is transferred. Accordingly, it is possible to easily group a power or ground circuit for equalization of the power or ground signal transferred to the semiconductor chips, to effortlessly achieve a wiring design for the drive signal or for the power and ground signals, and to increase the degree of freedom of wiring.

In addition, high thermal conductive silicon (Si) and the vertically extending vias may facilitate a downward discharge of heat generated from the semiconductor chips mounted on the wiring substrate. As a result, the semiconductor package may be provided to have high thermal radiation efficiency.

Moreover, as the semiconductor chips are connected to each other through a redistribution layer having a high line density in the interposer chip, a reduced electrical connection length may be accomplished between the semiconductor chips, and the semiconductor package may have improved electrical characteristics.

By way of summation and review, in some semiconductor packages, a semiconductor chip may be mounted on a printed circuit board (PCB) and bonding wires or bumps may be used to electrically connect the semiconductor chip to the printed circuit board. With the recent development of the electronics industry, the semiconductor package may be developed with a view toward compact size, small weight, and/or low manufacturing cost. In addition, many kinds of semiconductor packages may show up with the expansion of their application field such as high-capacity mass storage devices.

One or more embodiments may provide a semiconductor package with a high degree of freedom of wiring.

One or more embodiments may provide a semiconductor package with increased thermal radiation efficiency.

One or more embodiments may provide a semiconductor package with improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a substrate;
   a first semiconductor chip and a second semiconductor chip that are mounted on the substrate; and
   a plurality of external terminals below the substrate,
   wherein the substrate includes:
      a core portion;
      a first buildup portion and a second buildup portion respectively on top and bottom surfaces of the core portion, each of the first and second buildup portions including a dielectric pattern and a line pattern; and an interposer chip in an embedding region in the core portion and electrically connected to the first and second buildup portions, wherein the interposer chip includes:
a base layer;
a redistribution layer on a first surface of the base layer;
a via that penetrates the base layer, the via being connected to the redistribution layer and exposed at a second surface of the base layer;
a protection layer that covers the second surface of the base layer and exposes the via; and
a pad on one surface of the protection layer, the pad connecting the via to the line pattern of the second buildup portion, wherein the redistribution layer includes a chip conductive pattern embedded in a chip dielectric layer and is connected to the line pattern of the first buildup portion, wherein the via is connected to the line pattern of the second buildup portion, wherein a top surface of the chip dielectric layer of the redistribution layer of the interposer chip is located at a same level as a level of the top surface of the core portion, and the top surface of the chip dielectric layer of the redistribution layer of the interposer chip is in contact with the first buildup portion, wherein the redistribution layer is on the via, wherein, in the base layer, the via has a continuous flat sidewall, in cross section, wherein a top surface of the via is located at a same level as a level of the first surface of the base layer, wherein the redistribution layer of the interposer chip includes an upper chip pad having a first width, wherein the line pattern of the first buildup portion is directly connected to the upper chip pad of the redistribution layer of the interposer chip, a portion of the line pattern of the first buildup portion that is directly connected to the upper chip pad has a second width that is less than the first width, and wherein the line pattern of the second buildup portion is directly connected to the pad of the interposer chip.

2. The semiconductor package as claimed in claim 1, wherein:
the embedding region has an open hole shape that vertically penetrates the core portion, and
the interposer chip is spaced apart from an inner wall of the embedding region.

3. The semiconductor package as claimed in claim 2, further comprising an insulating layer that fills a gap between the interposer chip and the inner wall of the embedding region,
wherein the line pattern of the second buildup portion penetrates the insulating layer and is coupled to the via.

4. The semiconductor package as claimed in claim 2, wherein the core portion includes a plurality of core conductive patterns that are spaced apart from the embedding region and electrically connect the first buildup portion to the second buildup portion.

5. The semiconductor package as claimed in claim 1, wherein:
the core portion surrounds the interposer chip and contacts a lateral surface of the interposer chip, and
the core portion includes a through electrode that vertically penetrates the core portion and directly connects the line pattern of the first buildup portion to the line pattern of the second buildup portion.

6. The semiconductor package as claimed in claim 1, wherein the first semiconductor chip and the second semiconductor chip are electrically connected to each other through the first buildup portion and the interposer chip.

7. The semiconductor package as claimed in claim 1, wherein:
the embedding region is on an upper part of the core portion,
the interposer chip is on a floor surface of the embedding region, and
the line pattern of the second buildup portion penetrates the core portion and contacts the via of the interposer chip.

8. The semiconductor package as claimed in claim 1, wherein a bottom surface of the interposer chip is located at a higher level than a level of the bottom surface of the core portion.

9. The semiconductor package as claimed in claim 1, wherein the base layer of the interposer chip includes silicon.

10. The semiconductor package as claimed in claim 1, further comprising:
a molding layer on the first buildup portion, the molding layer covering the first and second semiconductor chips;
a redistribution substrate on the molding layer; and
a connection terminal that penetrates the molding layer and connects the redistribution substrate to the first buildup portion.

11. The semiconductor package as claimed in claim 1, wherein the top surface of the chip dielectric layer includes silicon oxide.

12. A semiconductor package, comprising:
a first wiring layer;
a second wiring layer on the first wiring layer;
an interposer chip between the first wiring layer and the second wiring layer;
an insulating layer between the first wiring layer and the second wiring layer, the insulating layer surrounding the interposer chip;
a conductive element between the first wiring layer and the second wiring layer, the conductive element being spaced apart from the interposer chip and connecting the first wiring layer to the second wiring layer;
a first semiconductor chip and a second semiconductor chip that are mounted on the second wiring layer;
a core portion between the first wiring layer and the second wiring layer, the core portion including an embedding region having an open hole shape that penetrates an inside of the core portion;
a molding layer on the second wiring layer, the molding layer covering the first and second semiconductor chips; and
a plurality of external terminals below the first wiring layer,
wherein the interposer chip includes:
a base layer;
a redistribution layer on the base layer and coupled to the second wiring layer;
a via in the base layer, the via connecting the redistribution layer to the first wiring layer;
a protection layer that covers a bottom surface of the base layer and exposes the via; and
a pad on one surface of the protection layer, the pad connecting the via to the first wiring layer, wherein the first semiconductor chip and the second semiconductor chip are electrically connected to each other though the interposer chip, wherein a bottom surface of the interposer chip is located at a higher level than a level of a bottom surface of the core portion, wherein the redistribution layer includes a chip conductive pattern embedded in a chip dielectric layer and connected to the line pattern of the first buildup portion, wherein a top surface of the chip dielectric layer of the redistribution layer of the interposer chip is contact with the first buildup portion, wherein the redistribution layer is on the via, wherein, in the base layer, the via has a continuous flat sidewall, in cross section, and wherein a top surface of the via is located at a same level as a level of a top surface of the base layer, wherein the redistribution layer of the interposer chip includes an upper chip pad having a first width, wherein a line pattern of the second wiring layer is directly connected to the upper chip pad of the redistribution layer of the interposer chip, the portion of the line pattern of the second wiring layer that is directly connected to the upper chip pad has a second width that is less than the first width, and wherein a line pattern of the first wiring layer is directly connected to the pad of the interposer chip.

13. The semiconductor package as claimed in claim 12, wherein the via vertically penetrates the base layer, the via being below the redistribution layer and exposed at the bottom surface of the base layer.

14. The semiconductor package as claimed in claim 12, wherein:

the insulating layer fills a space between the first wiring layer and the second wiring layer, and the conductive element includes a through electrode that vertically penetrates the insulating layer.

15. The semiconductor package as claimed in claim 12, wherein the first semiconductor chip and the second semiconductor chip are electrically connected to each other through the second wiring layer and the interposer chip.

* * * * *